US012701897B2

(12) United States Patent
Song et al.

(10) Patent No.: US 12,701,897 B2
(45) Date of Patent: Aug. 4, 2026

(54) SENSOR PACKAGE AND DISPLAY DEVICE

(71) Applicant: LITE-ON SINGAPORE PTE. LTD.,
Singapore (SG)

(72) Inventors: Guang-Li Song, Singapore (SG);
Wui-Pin Lee, Singapore (SG);
Sin-Heng Lim, Singapore (SG);
Rui-Tao Zheng, Singapore (SG);
Mon-Oo Win, Singapore (SG)

(73) Assignee: LITE-ON SINGAPORE PTE. LTD.,
Singapore (SG)

( * ) Notice: Subject to any disclaimer, the term of this
patent is extended or adjusted under 35
U.S.C. 154(b) by 436 days.

(21) Appl. No.: 18/520,712

(22) Filed: Nov. 28, 2023

(65) Prior Publication Data

US 2024/0188375 A1 Jun. 6, 2024

(30) Foreign Application Priority Data

Dec. 6, 2022 (CN) .......................... 202211558314.4

(51) Int. Cl.
*H10K 59/65* (2023.01)
*H10K 59/80* (2023.01)

(52) U.S. Cl.
CPC ........... *H10K 59/65* (2023.02); *H10K 59/873*
(2023.02); *H10K 59/8792* (2023.02); *H10K*
*59/8793* (2023.02)

(58) Field of Classification Search
CPC ........ H10K 59/60; H10K 59/65; H10K 39/32;
H10K 39/34; H10K 39/401; G09F 9/335;
H10W 90/00; H10W 90/10; H10F
55/155; H10F 39/12; H10F 39/1515;
H10F 19/20; H10F 19/80; H10F
39/80–8023; H10F 39/806; H10F
39/90–95; H10F 39/804; H10F 55/18;
H10F 55/255; G09G 2360/14–145; G01S
7/04; G01S 7/4813
See application file for complete search history.

(56) References Cited

U.S. PATENT DOCUMENTS

| | | | |
|---|---|---|---|
| 2011/0024627 A1* | 2/2011 | Yao ......................... | H10F 30/21 |
| | | | 250/353 |
| 2020/0141800 A1 | 5/2020 | Cook et al. | |
| 2023/0137017 A1* | 5/2023 | Ho ..................... | A61B 5/02427 |
| | | | 356/4.01 |

FOREIGN PATENT DOCUMENTS

| | | |
|---|---|---|
| TW | 201619576 A | 6/2016 |
| TW | 202136726 A | 10/2021 |

* cited by examiner

*Primary Examiner* — Julio J Maldonado
*Assistant Examiner* — Eric Manuel Mulero Flores
(74) *Attorney, Agent, or Firm* — Li & Cai Intellectual
Property (USA) Office

(57) ABSTRACT

A sensor package and a display device are provided. The
sensor package is disposed inside the display device. The
sensor package includes a substrate, a plurality of sensor
elements, a shielding cover, a first polarizer, and a second
polarizer. The plurality of sensor elements and the shielding
cover are disposed on the substrate. The shielding cover
covers the plurality of sensor elements. When light passes
through the first polarizer, the light forms a first polarized
light beam. When another light passes through the second
polarizer, the another light forms a second polarized light
beam. A first polarization direction of the first polarizer is
different from a second polarization direction of the second
polarizer.

18 Claims, 7 Drawing Sheets

SENSOR PACKAGE AND DISPLAY DEVICE

CROSS-REFERENCE TO RELATED PATENT APPLICATION

This application claims the benefit of priority to China Patent Application No. 202211558314.4, filed on Dec. 6, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor package and a display device, and more particularly to a sensor package and a display device that filter out excess light to improve contrast and quality of an image.

BACKGROUND OF THE DISCLOSURE

Organic light-emitting diodes (OLEDs) are mainly applied to panel structures of various types of display devices. Generally, in a display device, an ambient light sensor (ALS) and a proximity sensor are disposed under an OLED display panel. These sensors are mainly used to receive external light (e.g., sunlight) to control screen brightness and to achieve effects of power-saving. However, in existing technologies, unwanted light, such as backlight emitted from the OLED, is also received by the abovementioned sensors, which affects the accuracy of the sensors.

SUMMARY OF THE DISCLOSURE

In response to the above-referenced technical inadequacies, the present disclosure provides a sensor package. The sensor package includes a substrate, a first sensor element, a second sensor element, and a third sensor element, a shielding cover, a first polarizer, and a second polarizer. The chip is disposed on the substrate. The chip includes first, the second, and the third sensor elements disposed on the substrate. The shielding cover is disposed on the substrate and covers the first, the second, and the third sensor elements. The shielding cover has a first guiding opening and a second guiding opening, the first guiding opening corresponds to the first sensor element, and the second guiding opening corresponds to the second and the third sensor elements. The first polarizer and the second polarizer are disposed correspondingly to the second guiding opening. A first polarization direction of the first polarizer is different from a second polarization direction of the second polarizer. The shielding cover defines a gap between the first and the second polarizers and the second and the third sensor elements, so that the second sensor element senses first polarization light passing through the first polarizer and the second guiding opening, and the third sensor element senses second polarization light passing through the second polarizer and the second guiding opening.

In another aspect, the present disclosure provides a display device that adopts the sensor package of the present disclosure. The display device includes a protective glass, an organic light-emitting diode (OLED) member, a front polarizer, a phase retarder, and the sensor package. The front polarizer is disposed between the protective glass and the OLED member. The phase retarder disposed between the front polarizer and the OLED member. The sensor package is disposed adjacent to the OLED member.

Therefore, in the sensor package and the display device provided by the present disclosure, by virtue of "the shielding cover disposed on the substrate and covering the first, the second, and the third sensor elements," and "the first polarizer and the second polarizer being disposed in the second guiding opening; a first polarization direction of the first polarizer being different from a second polarization direction of the second polarizer," unnecessary light can be filtered out, so that a contrast and an image quality of the display device can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
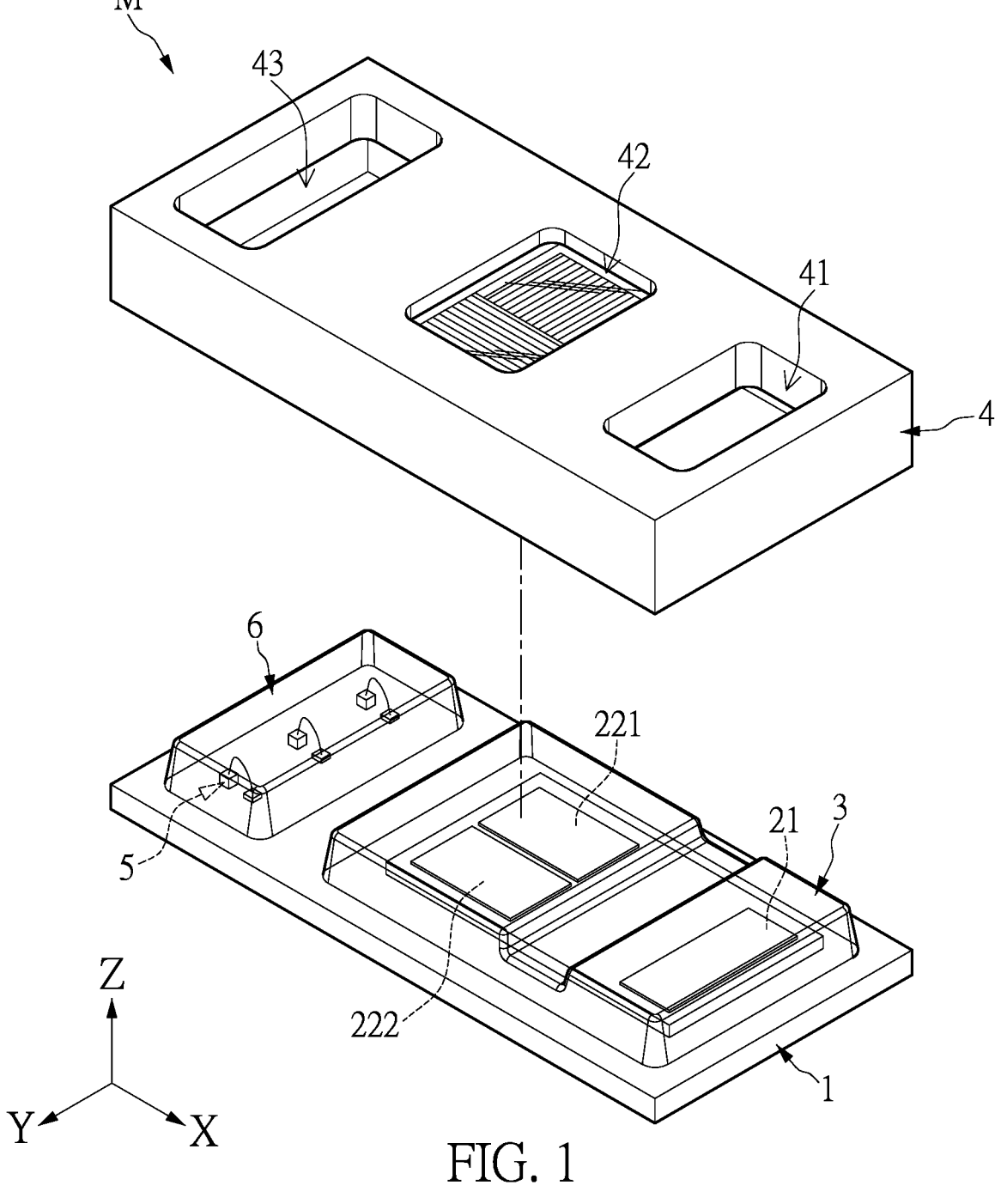
FIG. 1 is a schematic partially exploded view of a sensor package according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiments

Figure 2:
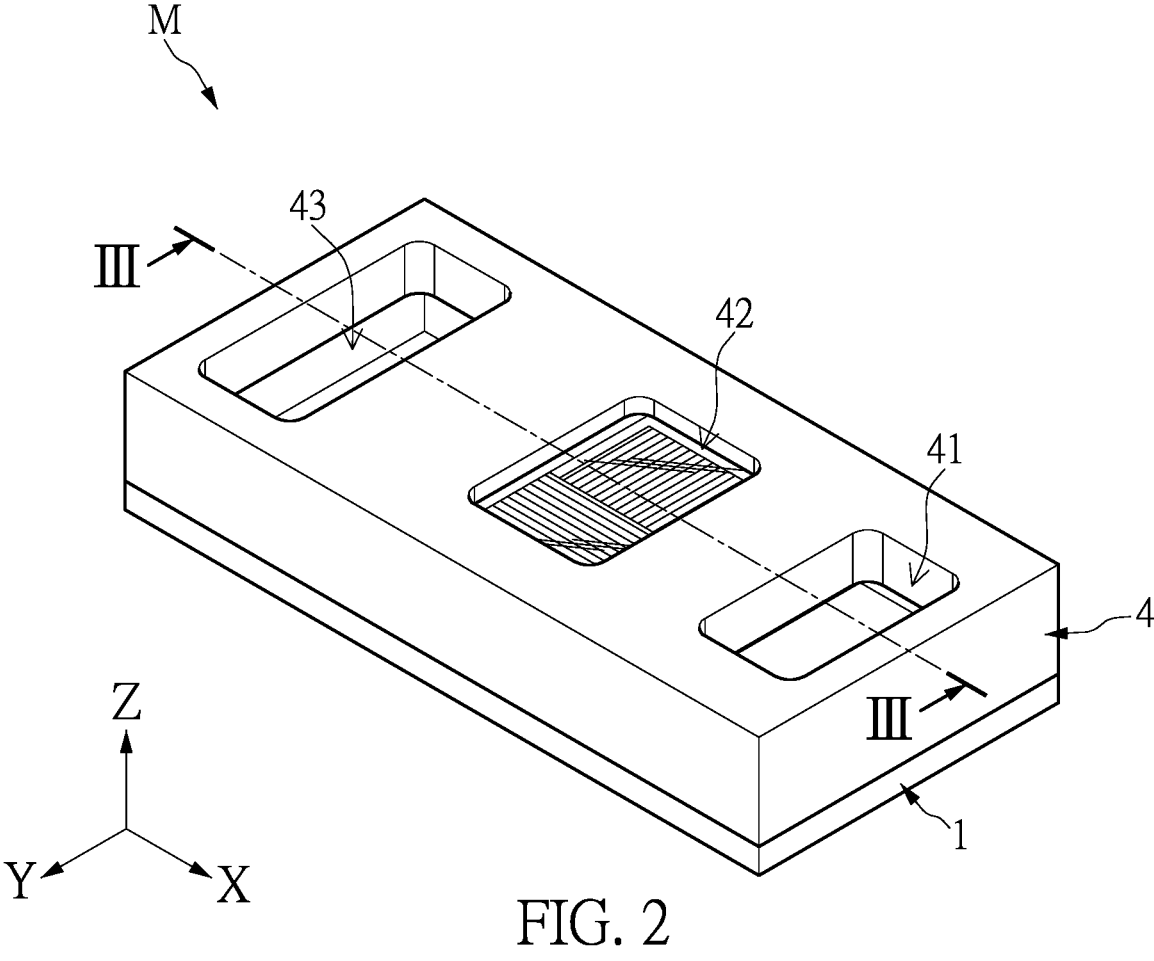
FIG. 2 is a schematic perspective view of the sensor package according to one embodiment of the present disclosure.
Figure 3:
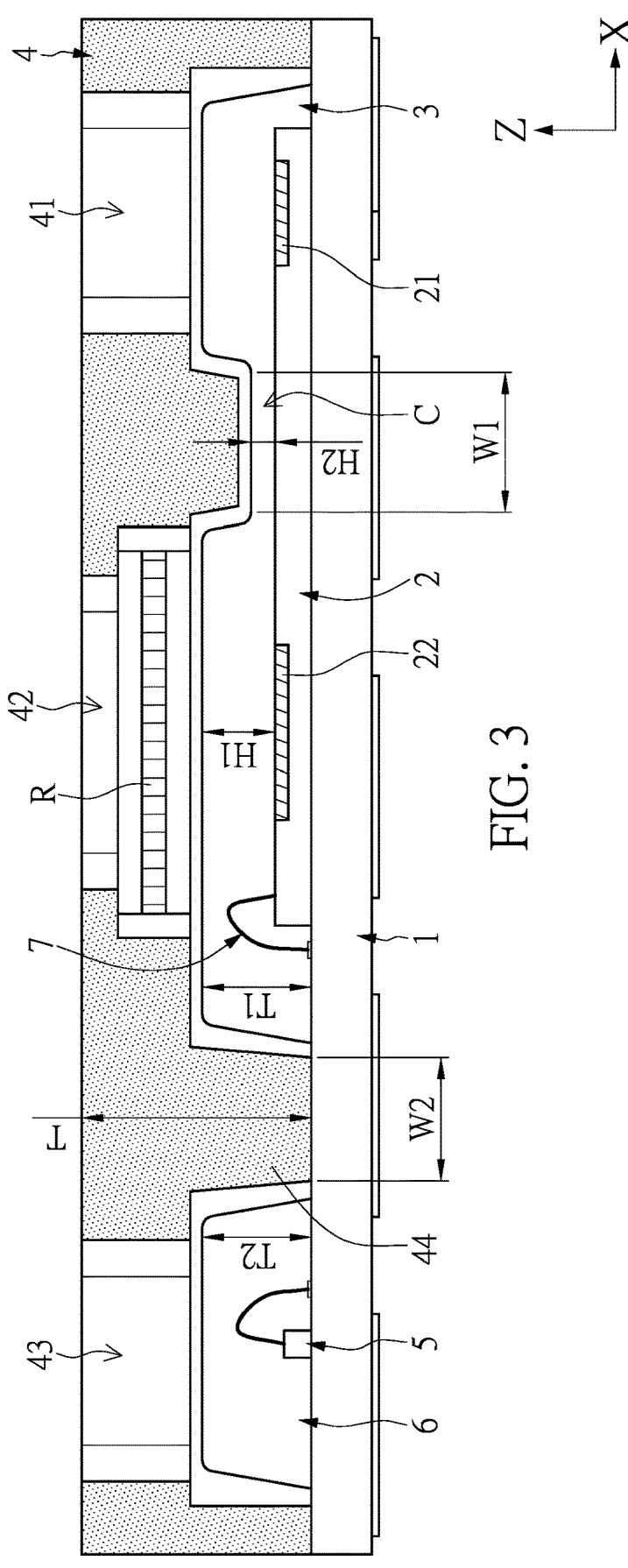
FIG. 3 is a schematic cross-sectional view taken along line III-III of FIG. 2.

Referring to FIG. 1 to FIG. 3, FIG. 1 is a schematic partially exploded view of a sensor package according to one embodiment of the present disclosure, FIG. 2 is a schematic perspective view of the sensor package according to one embodiment of the present disclosure, and FIG. 3 is a schematic cross-sectional view taken along line III-III of FIG. 2. The present disclosure provides a sensor package M that is applicable to display screens of electronic devices (such as mobile phones). The sensor package M mainly includes a substrate 1, a chip 2, a first encapsulant 3, a shielding cover 4, and a polarizer R. The chip 2 is disposed on the substrate 1. The first encapsulant 3 covers the chip 2. The shielding cover 4 is disposed on the substrate 1 and covers the first encapsulant 3. The chip 2 includes a first sensor element 21 and an optical sensor element 22. The shielding cover 4 has a first guiding opening 41 and a second guiding opening 42, the first guiding opening 41 corresponds to the first sensor element 21, and the second guiding opening 42 corresponds to the optical sensor element 22. The polarizer R is disposed in the second guiding opening 42. Therefore, an external light can be received by the first sensor element 21 and the optical sensor element 22 through the first guiding opening 41 and the second guiding opening 42, respectively.

In the present disclosure, the first sensor element 21 is a proximity sensor, and the optical sensor element 22 is an ambient light sensor (ALS). The ambient light sensor can sense a brightness of an ambient light of regions that surround the sensor package M, so as to adjust screen brightness to a brightness that is suitable for human eyes. The proximity sensor can be configured to detect a distance between a facial region of a user and the display screen of the electronic device. Therefore, when the proximity sensor comes near the facial region of the user, the electronic device can automatically switch off the display screen and disable a touch-control function, so as to prevent a conversation from being interrupted by the face of the user that inadvertently touches the display screen during a phone call, and to achieve an effect of power-saving.

Figure 4:
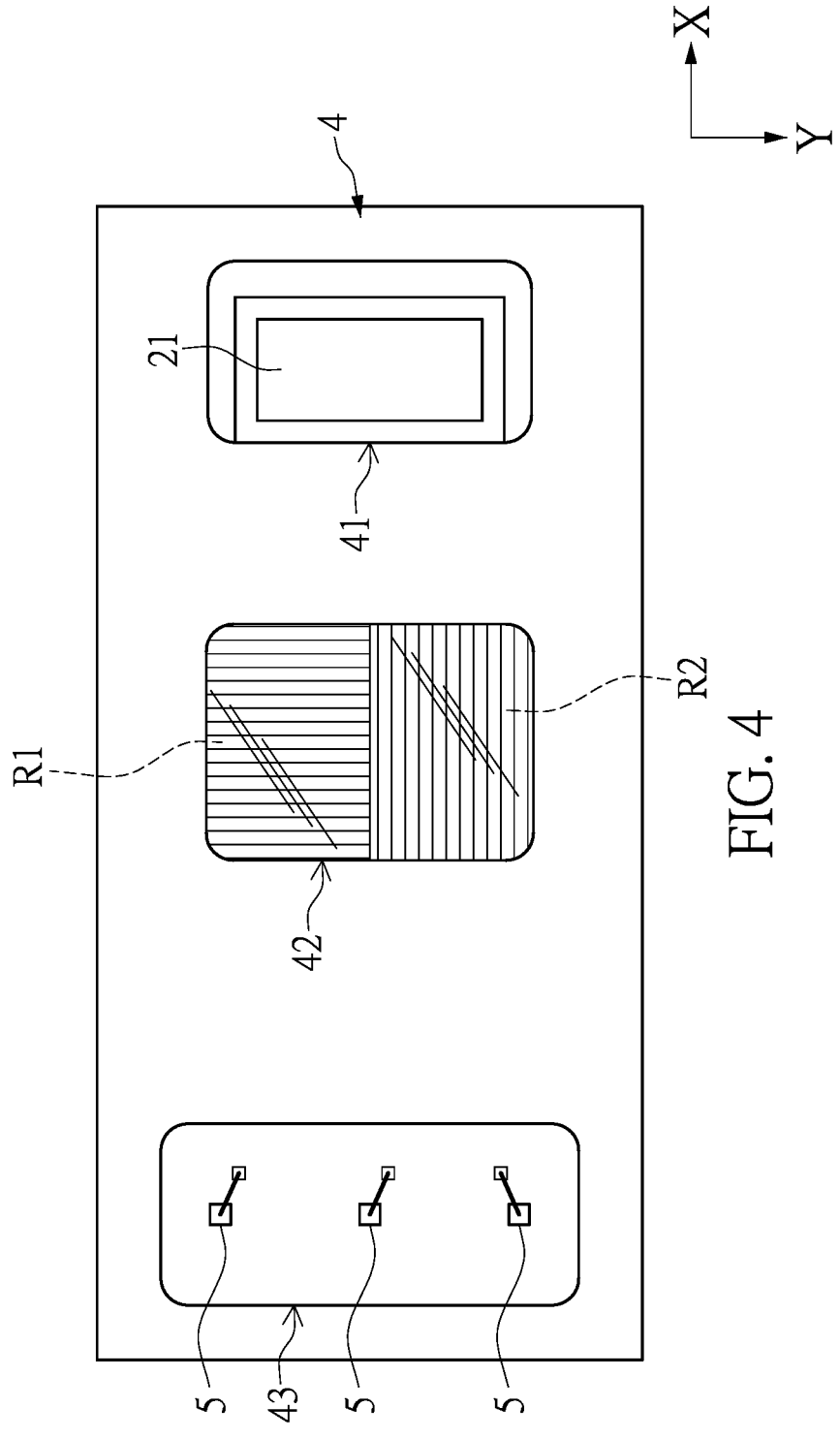
FIG. 4 is a schematic top view of the sensor package according to one embodiment of the present disclosure.
Figure 5:
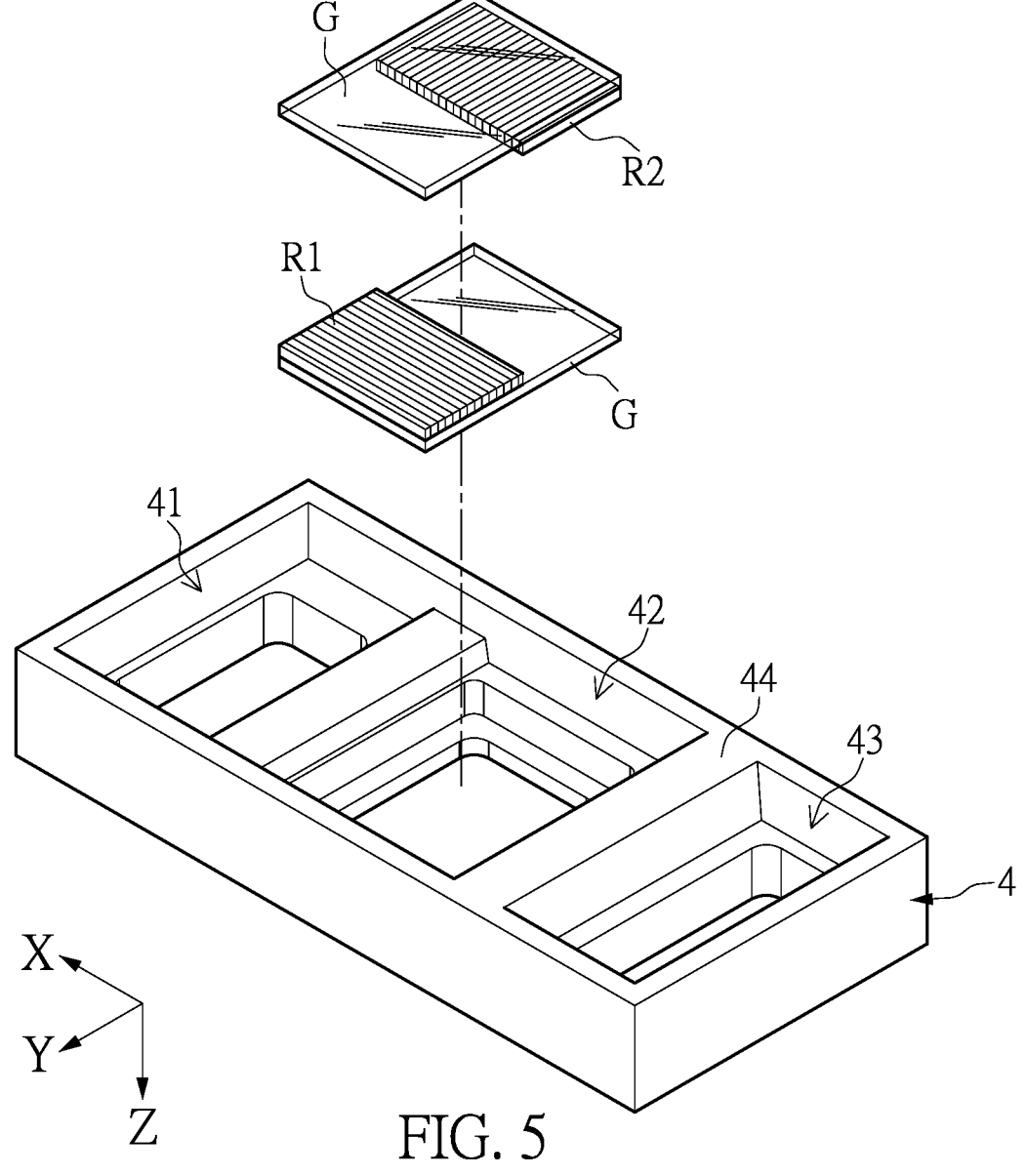
FIG. 5 is a schematic view of a shielding cover and first and second polarizers of the sensor package according to one embodiment of the present disclosure.

Referring to FIG. 1, FIG. 4, and FIG. 5, FIG. 4 is a schematic top view of the sensor package according to one embodiment of the present disclosure, and FIG. 5 is a schematic view of a shielding cover and first and second polarizers of the sensor package according to one embodiment of the present disclosure. The chip 2 can be electrically connected to the substrate 1 through a plurality of wires 7. Specifically, in the present disclosure, the chip 2 includes the first sensor element 21 and the optical sensor element 22 that are disposed adjacent to each other. The optical sensor element 22 includes a second sensor element 221 and a third sensor element 222. The polarizer R includes a first polarizer R1 and a second polarizer R2 that are both disposed in the second guiding opening 42. Moreover, a projection area of the first polarizer R1 projected on the chip 2 completely covers the second sensor element 221, a projection area of the second polarizer R2 projected on the chip 2 completely covers the third sensor element 222, and the projection area of the first polarizer R1 projected on the chip 2 does not overlap with the projection area of the second polarizer R2 projected on the chip 2. The shielding cover defines a gap between the first and the second polarizers R1 and R2 and the second and third sensor elements 221 and 222, so that the second sensor element 221 senses first polarization light passing through the first polarizer R1 and the second guiding opening 42, and the third sensor element 222 senses second polarization light passing through the second polarizer R2 and the second guiding opening 42. When light passes through the first polarizer R1, the light forms a first polarized light beam. When another light passes through the second polarizer R2, the another light forms a second polarized light beam. A first polarization direction of the first polarizer R1 is different from a second polarization direction of the second polarizer R2. In the present disclosure, by the design of polarization directions of lights from the two polarizers being perpendicular to each other, any unnecessary light can be filtered out and prevented from entering the sensor package M and being received by the second and third sensor elements 221 and 222.

In addition, a manufacturing process of the polarizers R (i.e., the first polarizer R1 and the second polarizer R2) is not limited in the present disclosure. For example, the polarizers R can be manufactured by laminating polarizing films on glasses and cutting the polarizing films by using lasers. On the other hand, the polarizers R can be manufactured by using wire grids that is made of multiple thin metal wires in parallel arrangement.

Moreover, the first polarizer R1 and the second polarizer R2 having different polarizing directions (e.g., having polarizing directions that are perpendicular to each other, such as two directions along angles of 0° and 90°) are emerged on a transparent plate (i.e., a glass or plastic plate) that is disposed at a top or a bottom of the shielding cover or at an opening corresponding to the ALS (e.g., the second guiding opening 42 corresponding to the optical sensor element 22). A way of disposing the first polarizer R1 and the second polarizer R2 can be respectively disposing the first polarizer R1 and the second polarizer R2 on two glass plates G, and matching the two glass plates G together such that the first polarizer R1 and the second polarizer R2 are coplanar, as shown in FIG. 5. When the first polarizer R1 and the second polarizer R2 are coplanar, the first polarizer R1 and the second polarizer R2 can be tightly adjacent to each other.

Reference is further made to FIG. 1, and the sensor package M further includes a light-emitting element 5 and a second encapsulant 6. The light-emitting element 5 is disposed on the substrate 1, the second encapsulant 6 covers the light-emitting element 5, and the shielding cover 4 covers the second encapsulant 6. In addition, the shielding cover 4 further has a third guiding opening 43, and the third guiding opening 43 corresponds to the light-emitting element 5, such that light emitted by the light-emitting element 5 can be emitted through the third guiding opening 43 outward to the outside of the sensor package M. In this embodiment, the sensor package M includes three of the light-emitting elements 5, and the three light-emitting elements 5 are connected to the substrate 1 through the wires 7, respectively. However, a quantity of the light-emitting elements 5 is not limited in the present disclosure.

Accordingly, the light-emitting element 5 is configured to emit light (such as an infrared light), and the light-emitting element 5 emits an light onto an object (such as the face of the user) located externally, and the emitted light is reflected by the object and then received by the first sensor element 21 (i.e., the proximity sensor), so that the first sensor element 21 performs distance estimation according to the emitted light and the reflected light. For example, in this embodiment, the three light-emitting elements 5 can be vertical cavity surface emitting laser (VCSEL) diodes. By the design of the VCSEL diodes, light emitted in the present disclosure has small divergent angle and high purity, such that an output power of the light-emitting elements 5 can be improved, and the sensitivity of the first sensor element 21 can also be increased.

Reference is further made to FIG. 1 and FIG. 3, for example, the first encapsulant 3 and the second encapsulant 6 are light-transmissive gels, and the shielding cover 4 is made of a non-light-transmissive plastic material. The shielding cover 4 forms a half-cut isolator between the first sensor element 21 and the optical sensor element 22, so that the first encapsulant 3 forms a channel C between the first sensor element 21 and the optical sensor element 22. A predetermined height H1 is defined between a top surface of the first encapsulant 3 and a surface of the chip 2, and a height H2 of the channel C is less than the predetermined height H1. Furthermore, the height H2 of the channel C is not greater than half of the predetermined height H1. Therefore, from the appearance of the first encapsulant 3 as shown in FIG. 1, a concaved region is formed between the top surface of the first encapsulant 3 and the surface of the chip 2. Preferably, the height H2 of the channel C is between 0.05 mm and 0.15 mm, and a width W1 of the channel C is between 0.2 mm and 0.5 mm. By the design of the aforementioned half-cut isolator, the height H2 of the channel C is less than the predetermined height H1. Therefore, when an external light enters from the first guiding opening 41 to the region in which the first sensor element 21 is located in the first encapsulant 3, the external light that enters through the channel C to the region in which the optical sensor element 22 is located is reduced, so that an optical noise is reduced, and a sensing performance of the optical sensor element 22 is improved.

The shielding cover 4 is mainly used to constrain the view angle of incoming light, such that light incoming in specific angle region is allowed to enter the optoelectronic sensor packaging structure, M, such as a backlight from an organic light-emitting diode (OLED) being blocked from leaking in various directions to an ALS. For example, when the sensor package M of the present disclosure is applied to an OLED display screen, the shielding cover 4 can block backlight from the OLED from being leaked in various directions to the optical sensor element 22 of the sensor package M, thereby preventing an accuracy of the optical sensor element 22 during sensing from being affected.

Furthermore, as shown in FIG. 3, a wall 44 is formed by the shielding cover 4 between the first encapsulant 3 and the second encapsulant 6. A height T of the wall 44 is greater than a height T1 of the first encapsulant 3 and a height T2 of the second encapsulant 6. Furthermore, a width W2 of the wall 44 is between 0.18 mm and 0.5 mm. The wall 44 is mainly used to divide the light-emitting element 5 from the chip 2, so as to prevent the infrared light emitted from the light-emitting element 5 leaking to the first sensor element 21 via internal structure of the sensor package M and affecting the performance of the first sensor element 21.

Figure 6:
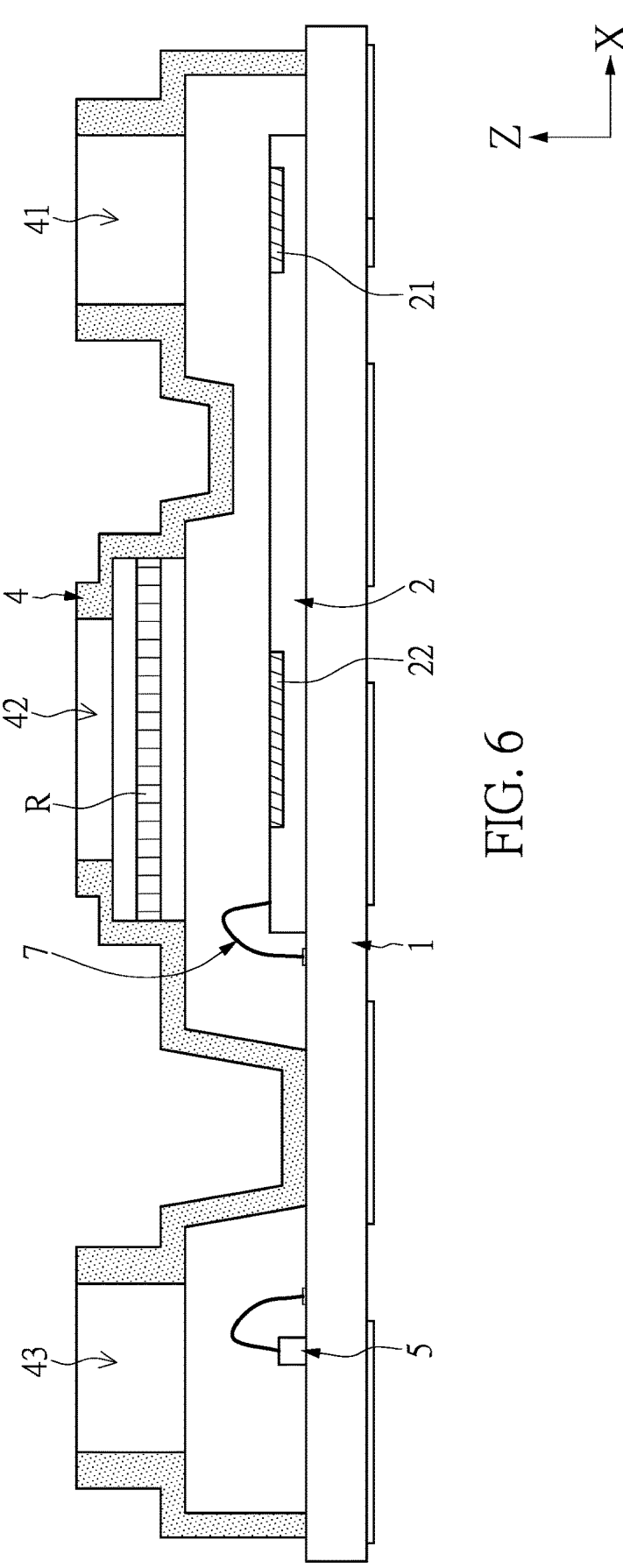
FIG. 6 is a schematic cross-sectional view of the sensor package according to another embodiment of the present disclosure.

As shown in FIG. 6, FIG. 6 is a schematic cross-sectional view of the sensor package according to another embodiment of the present disclosure. In another embodiment, the sensor package M can be provided without the encapsulant. In other words, the chip 2 and the light-emitting element 5 are covered only by the shielding cover 4. Further, the shielding cover 4 is made of a non-light-transmissive material that can be metal or plastic. Moreover, according to different optical requirements of reducing optical noise or increasing light intensity, the shielding cover 4 can be made of a mixture of a resin material and a light-absorption or light-reflective material, or the light-absorption or light-reflective material can be coated on an outer surface of the shielding cover 4.

Figure 7:
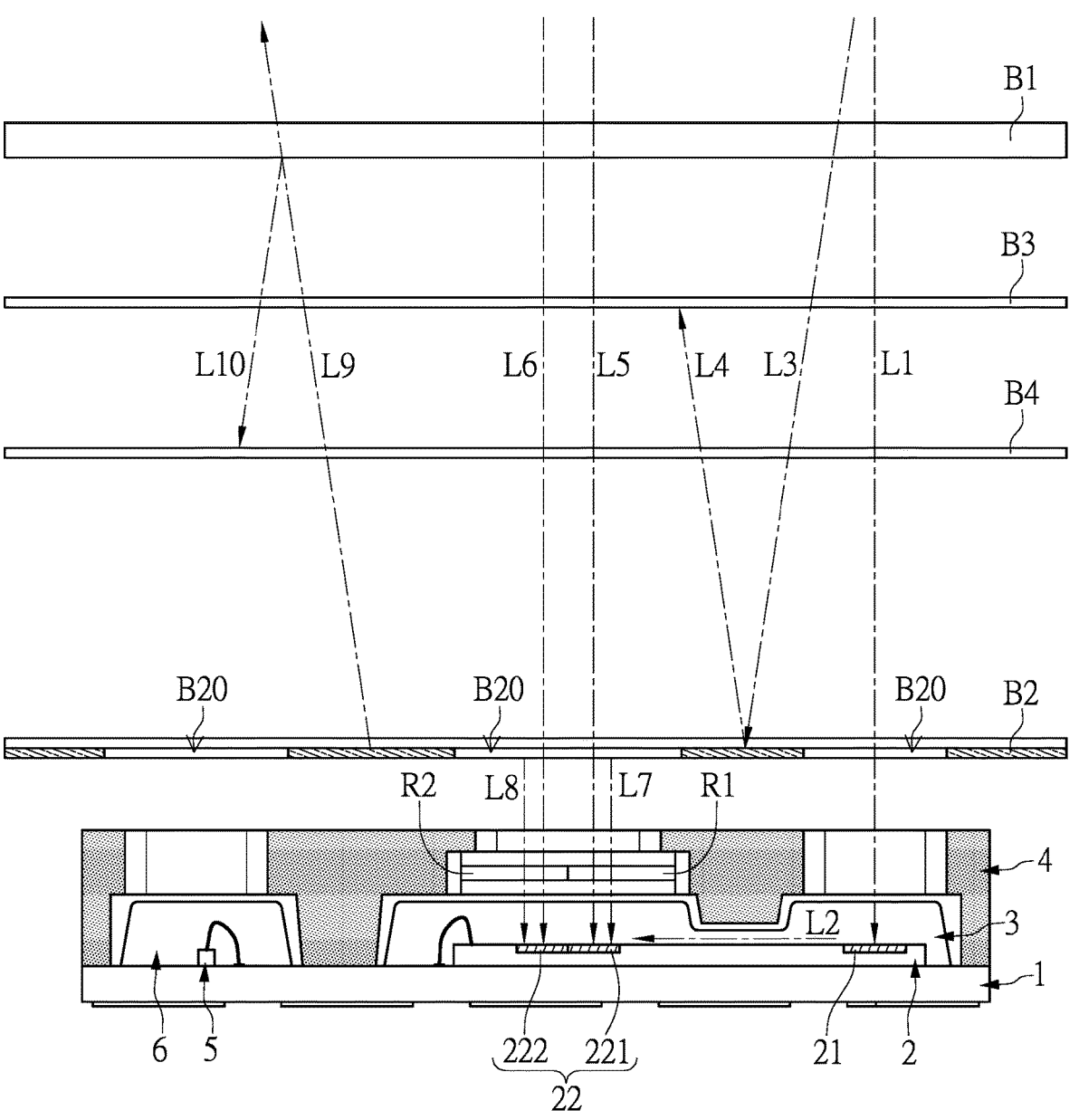
FIG. 7 is a schematic view of a display device according to one embodiment of the present disclosure.

As shown in FIG. 7, FIG. 7 is a schematic view of a display device according to one embodiment of the present disclosure. The present disclosure provides a display device D that includes a protective glass B1, an organic light-emitting diode (OLED) member B2, a front polarizer B3, a phase retarder B4, and the sensor package M as mentioned above. The display device D can be a display screen of an electronic device (e.g., a mobile phone, computer, or tablet computer), but the present disclosure is not limited thereto. The front polarizer B3 is disposed between the protective glass B1 and the OLED member B2, and the phase retarder B4 is disposed between the front polarizer B3 and the OLED member B2. The phase retarder B4 is a quarter-wave plate for adjusting a polarization state of lights (e.g., causing two lights in different polarization directions to have a phase difference of a quarter wavelength therebetween). The sensor package M is disposed adjacent to the OLED member B2. The OLED member B2 has at least three openings B20 that correspond to the first guiding opening 41, the second guiding opening 42, and the third guiding opening 43, respectively. A width of each of the at least three openings B20 is greater than a width of each of the first guiding opening 41, the second guiding opening 42, and the third guiding opening 43 that correspond to the at least three openings B20. It should be noted that, for ease of illustration, the first polarizer R1 and the second polarizer R2, and the second sensor element 221 and the third sensor element 222 are simultaneously shown in FIG. 6. However, the arrangement shown in FIG. 1 can be referred to as a practical configuration.

Referring to FIG. 3 and FIG. 7, when external light (e.g., sunlight) enters the display device, the external light sequentially pass through the protective glass B1 and the front polarizer B3 to form a polarized light beam. The polarized light beam then passes through the phase retarder to become the polarized light beam that is circularly polarized. As shown in FIG. 7, external light can be defined as ambient lights L1 and L3, and first ambient light L5 and second ambient light L6. The ambient light L1 enters the sensor package M through one of the openings B20 of the OLED member B2 and the first guiding opening 41. Light L2 that is a portion of the ambient light L1 that enters the sensor package M will enter through the channel C. However, due to the structural design of the channel C of the present disclosure, consideration for the light L2 can be omitted. In addition, in other embodiments, the ambient light L1 can also be a reflected light that is light that is emitted by the light-emitting element 5 onto an object (such as the face of the user) and reflected by the object.

The ambient light L3 does not accurately enter any of the openings B20 of the OLED member B2, and is reflected by the OLED member B2 to become a reflected light L4 that passes through the phase retarder B4. At this time, due to a change in a polarization direction of the reflected light L4, the reflected light L4 is unable to pass through the front polarizer B3, and remains between the phase retarder B4 and the front polarizer B3, thereby increasing a contrast and brightness of the display screen.

The first ambient light L5 and the second ambient light L6 enter the sensor package M through one of the openings B20 of the OLED member B2 and the second guiding opening 41. Furthermore, the first ambient light L5 and the second ambient light L6 pass through the first polarizer R1 and the second polarizer R2, respectively. Then, the first ambient light L5 that passes through the first polarizer R1 is received by the second sensor element 221, and the second ambient light L6 that passes through the second polarizer R2 is received by the third sensor element 222. A light power received by the second sensor element 221 (i.e., an ALS) is $\alpha1 \times N$, in which $\alpha1$ is a power factor, and N is a total power of the first ambient light L5 before the first ambient light L5 enters the sensor package M. A light power received by the third sensor element 222 (i.e., an ALS) is $\alpha2 \times N$, in which $\alpha2$ is a power factor, and N is a total power of the second ambient light L6 before the second ambient light L6 enters the sensor package M (in this embodiment, the first ambient light L5 and the second ambient light L6 are both sunlight, so that the total power of the two lights are the same), and a sum of $\alpha1$ and $\alpha2$ is 1.

In addition, a portion of the light generated by the OLED member B2, that is, first backlight L7 and second backlight L8, enter the sensor package M through the second guiding opening 42. The first backlight L7 and the second backlight L8 pass through the first polarizer R1 and the second polarizer R2, respectively. The first backlight L7 that passes through the first polarizer R1 is received by the second sensor element 221, and the second backlight L8 that passes through the second polarizer R2 is received by the third sensor element 222. A light power received by the second sensor element 221 is $\beta1 \times E$, in which $\beta1$ is a power factor, and E is a total power of the first backlight L7 before the first backlight L7 enters the sensor package M. A light power received by the third sensor element 222 is $\beta2 \times E$, in which $\beta2$ is a power factor, and E is a total power of the second backlight L8 before the second backlight L8 enters the sensor package M (in this embodiment, the first backlight L7 and the second backlight L8 are both lights generated by the OLED member B2, so that the total power of the two lights are the same), and a sum of $\beta1$ and $\beta2$ is 1.

Then, the second and third sensor elements 221 and 222 combine the first and second ambient lights L5 and L6 and the first and second backlights L7 and L8, and respectively obtain calibrated values G1 and G2 through a calibration formula, where the calibration formula is as follows:

$$\begin{bmatrix} G1 \\ G2 \end{bmatrix} = \begin{bmatrix} \alpha_1 & \beta_1 \\ \alpha_2 & \beta_2 \end{bmatrix} \begin{bmatrix} N \\ E \end{bmatrix}.$$

Through the aforementioned calibration, the sensor package compensates the reading of the ambient light sensor by via differences between the second and third sensor elements 221 and 222, and the two polarizers (i.e., the first polarizer R1 and the second polarizer R2), so as to eliminate negative effects caused by unnecessary lights (i.e., optical noise, such as a backlight generated by the OLED member B2) that enter the ambient light sensor, thereby improving an accuracy of sensing performed by the optical sensor element 22.

Another portion of the light generated by the OLED element B2, that is, light L9, is emitted outward from the display device D. A portion of the light L9 is emitted to the outside of the display device D, and another portion of the light L9 is reflected by the protective glass B1 to become a reflected light L10 and remain between the phase retarder B4 and the front polarizer B3, thereby increasing a contrast and brightness of the display screen.

Beneficial Effects of the Embodiments

In conclusion, the present disclosure provides the sensor package M that is applicable to the display device D (e.g., a display screen of an electronic device). The sensor package M mainly includes the substrate 1, the chip 2, the first encapsulant 3, the shielding cover 4, and the polarizers (i.e., the first polarizer R1 and the second polarizer R2). In the present disclosure, the sensor package M can increase a sensing accuracy of the optical sensor element 22 (an ALS) by the design of the two polarizers (i.e., the first polarizer R1 and the second polarizer R2) corresponding to the two optical sensor elements (i.e., the second sensor element 221 and the third sensor element 222), respectively. In addition, by the shielding cover 4 shielding the sensor package M of the present disclosure, an angle at which an external light is allowed to enter the sensor package M is limited, such that unnecessary lights are blocked. For example, a backlight from an organic light-emitting diode (OLED) is blocked from being leaked in various directions to an ALS. Furthermore, in the sensor package M of the present disclosure, by the design of the height H2 of the channel C in the first encapsulant 3 being less than the predetermined height H1, when an external light enters from the first guiding opening 41 to the region in which the first sensor element 21 is located in the first encapsulant 3, the external light that enters through the channel C to the region in which the optical sensor element 22 is located is reduced, so that a sensing performance of the optical sensor element 22 is improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package, comprising:
a substrate;
first, second, and third sensor elements disposed on the substrate;
a shielding cover disposed on the substrate and covering the first, the second, and the third sensor elements, wherein the shielding cover has a first guiding opening and a second guiding opening, the first guiding opening corresponds to the first sensor element, and the second guiding opening corresponds to the second and the third sensor elements;

first and second polarizers disposed correspondingly to the second guiding opening, wherein a first polarization direction of the first polarizer is different from a second polarization direction of the second polarizer;

wherein, the shielding cover defines a gap between the first and the second polarizers and the second and the third sensor elements, so that the second sensor element senses first polarization light passing through the first polarizer and the second guiding opening, and the third sensor element senses second polarization light passing through the second polarizer and the second guiding opening.

2. The sensor package according to claim 1, further comprising: a first encapsulant covering the first, the second, and the third sensor elements, wherein a predetermined height is defined between a top surface of the first encapsulant and the second and the third sensor elements, a channel is formed by the first encapsulant between the first sensor element and the second and the third sensor elements, and a height of the channel is not greater than half of the predetermined height.

3. The sensor package according to claim 1, further comprising: a light-emitting element disposed on the substrate, wherein the shielding cover covers the light-emitting element, and the shielding cover further has a third guiding opening that corresponds to the light-emitting element; wherein the light-emitting element emits light onto an object located externally by passing through the third guiding opening, the emitted light is reflected by the object and then received by the first sensor element for allowing the first sensor element to perform distance estimation.

4. The sensor package according to claim 3, further comprising: a first encapsulant, and a second encapsulant, wherein the first encapsulant covers the first, the second, and the third sensor elements and the second encapsulant covers the light-emitting element, wherein a wall is formed by shielding cover between the first encapsulant and the second encapsulant.

5. The sensor package according to claim 4, wherein a height of the wall is greater than a height of the first encapsulant and a height of the second encapsulant.

6. The sensor package according to claim 4, wherein the first sensor element is a proximity sensor, the second and the third sensor elements are ambient light sensors, and the light-emitting element is a vertical cavity surface emitting laser diode.

7. The sensor package according to claim 1, wherein the first and the second polarizers are emerged on a transparent plate that is disposed at a top or a bottom of the shielding cover.

8. A display device, comprising:
a protective glass;
an organic light-emitting diode (OLED) member having at least two openings that correspond to the first guiding opening and the second guiding opening, respectively;
a front polarizer disposed between the protective glass and the OLED member;
a phase retarder disposed between the front polarizer and the OLED member; and
the sensor package as claimed in claim 1, disposed adjacent to the OLED member.

9. The display device according to claim 8, wherein a width of each of the at least two openings is greater than a width of each of the first guiding opening and the second guiding opening that correspond to the at least two openings.

10. The display device according to claim 8, wherein the sensor package is configured to receive first ambient light and second ambient light, and the first ambient light and the second ambient light enter the sensor package through one of the at least two openings of the OLED member and the second guiding opening; wherein the first ambient light passes through the first polarizer and is received by the second sensor element, and the second ambient light passes through the second polarizer and is received by the third sensor element.

11. The display device according to claim 8, wherein the OLED member emits first backlight and second backlight, and the first backlight and the second backlight enter the sensor package through the second guiding opening; wherein the first backlight passes through the first polarizer and is received by the second sensor element, and the second backlight passes through the second polarizer and is received by the third sensor element.

12. The display device according to claim 8, further comprising: a first encapsulant covering the first, the second, and the third sensor elements, wherein a predetermined height is defined between a top surface of the first encapsulant and the first, the second, and the third sensor elements, a channel is formed by the first encapsulant between the first sensor element and the second and third sensor elements and a height of the channel is not greater than half of the predetermined height.

13. The display device according to claim 8, further comprising: a light-emitting element disposed on the substrate, wherein the shielding cover covers the light-emitting element, and the shielding cover further has a third guiding opening that corresponds to the light-emitting element.

14. The display device according to claim 13, further comprising: a first encapsulant and a second encapsulant, wherein the first encapsulant covers the three sensor elements, the second encapsulant covers the light-emitting element, and the shielding cover covers the first encapsulant and the second encapsulant.

15. The display device according to claim 14, wherein a wall is formed by the shielding cover between the first encapsulant and the second encapsulant, and a height of the wall is greater than a height of the first encapsulant and a height of the second encapsulant.

16. A display device, comprising:
a protective glass;
an organic light-emitting diode (OLED) member having at least three openings that correspond to the first guiding opening, the second guiding opening, and the third guiding opening, respectively;
a front polarizer disposed between the protective glass and the OLED member;
a phase retarder disposed between the front polarizer and the OLED member; and
the sensor package as claimed in claim 4, disposed adjacent to the OLED member.

17. The display device according to claim 16, wherein a width of each of the at least three openings is greater than a width of each of the first guiding opening, the second guiding opening, and the third guiding opening that correspond to the at least three openings.

18. The display device according to claim 16, wherein the OLED member emits first backlight and second backlight, and the first backlight and the second backlight enter the sensor package through the second guiding opening; wherein the first backlight passes through the first polarizer and is received by the second sensor element, and the second backlight passes through the second polarizer and is received by the third sensor element; wherein the light-emitting element emits light onto an object located externally by passing through the third guiding opening, the emitted light is reflected by the object and then the reflected light is received by the first sensor element, so that the first sensor element performs distance estimation.

\*  \*  \*  \*  \*